United States Patent
Rodin et al.

(10) Patent No.: US 6,785,871 B2
(45) Date of Patent: Aug. 31, 2004

(54) AUTOMATIC RECOGNITION OF AN OPTICALLY PERIODIC STRUCTURE IN AN INTEGRATED CIRCUIT DESIGN

(75) Inventors: Sergei Rodin, Moscow (RU); Evgueny E. Egorov, Moscow (RU); Stanislav V. Aleshin, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 114 days.

(21) Appl. No.: 10/225,909

(22) Filed: Aug. 21, 2002

(65) Prior Publication Data

US 2004/0040002 A1 Feb. 26, 2004

(51) Int. Cl.[7] .......................... G06F 17/50; G06F 9/455; G06F 9/45
(52) U.S. Cl. ................... 716/2; 716/20; 716/11; 716/19; 716/8
(58) Field of Search ............... 716/20, 19, 11, 716/8

(56) References Cited

U.S. PATENT DOCUMENTS

| | | | | |
|---|---|---|---|---|
| 5,515,293 A | * | 5/1996 | Edwards | 716/11 |
| 5,696,693 A | * | 12/1997 | Aubel et al. | 716/8 |
| 5,734,582 A | * | 3/1998 | Bertolet et al. | 716/8 |
| 6,430,737 B1 | * | 8/2002 | Cobb et al. | 716/19 |
| 2004/0003366 A1 | * | 1/2004 | Suzuki | 716/11 |

* cited by examiner

Primary Examiner—A. M. Thompson
(74) Attorney, Agent, or Firm—Fitch, Even, Tabin & Flannery

(57) ABSTRACT

A method of finding an optically periodic structure in a cell layer of an integrated circuit design includes receiving as input a physical representation of a cell layer of an integrated circuit design, finding reference coordinates of a selected portion of the cell layer from the physical representation of a cell layer, selecting an initial element located nearest to the reference coordinates, and constructing a base structure that includes the initial element and a minimum number of elements in the physical representation of the cell layer wherein the base structure may be replicated at an X-offset and a Y-offset to fill the entire selected portion so that for each element in each replica of the base structure there is an identical element at identical coordinates in the physical representation of the cell layer.

17 Claims, 6 Drawing Sheets

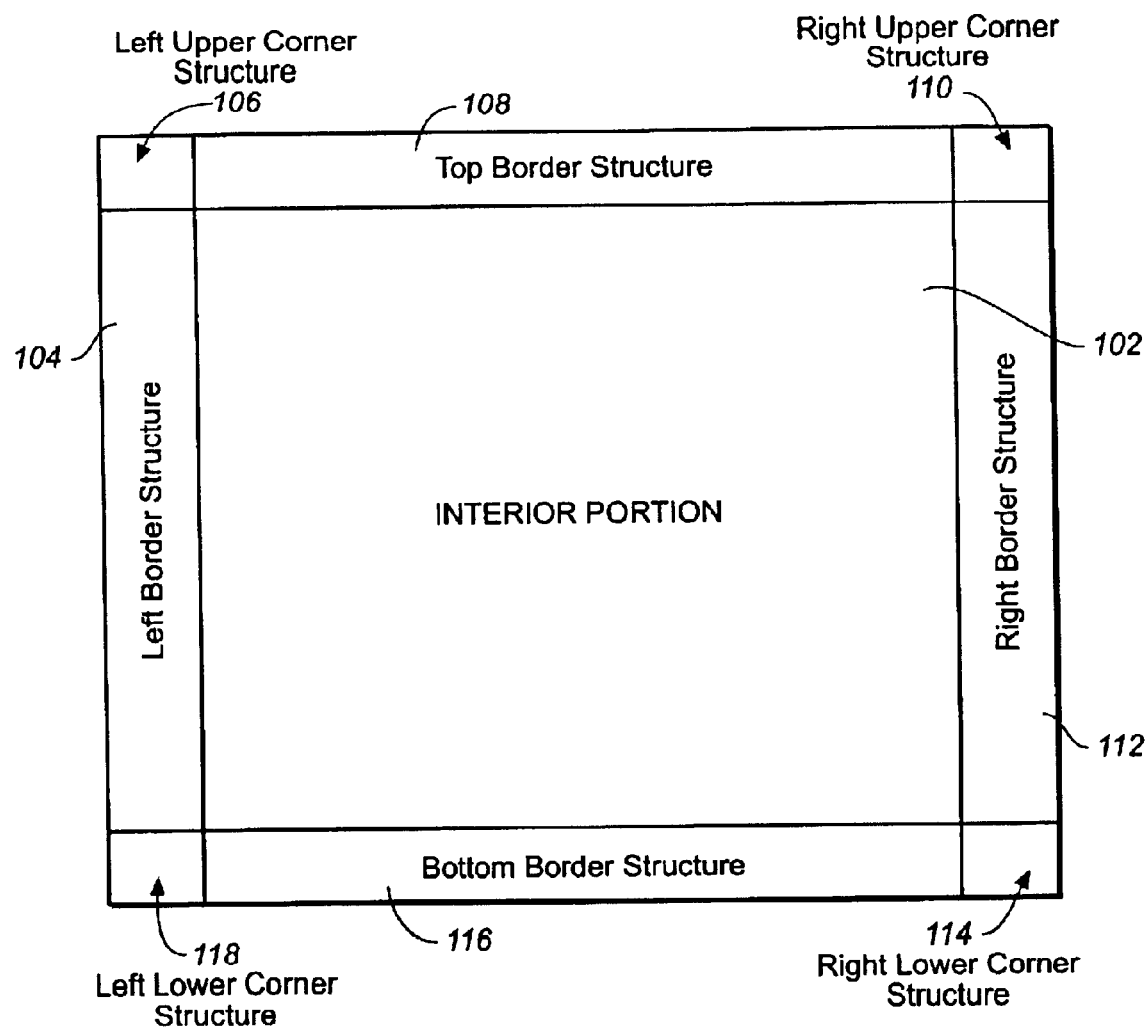
FIG._1

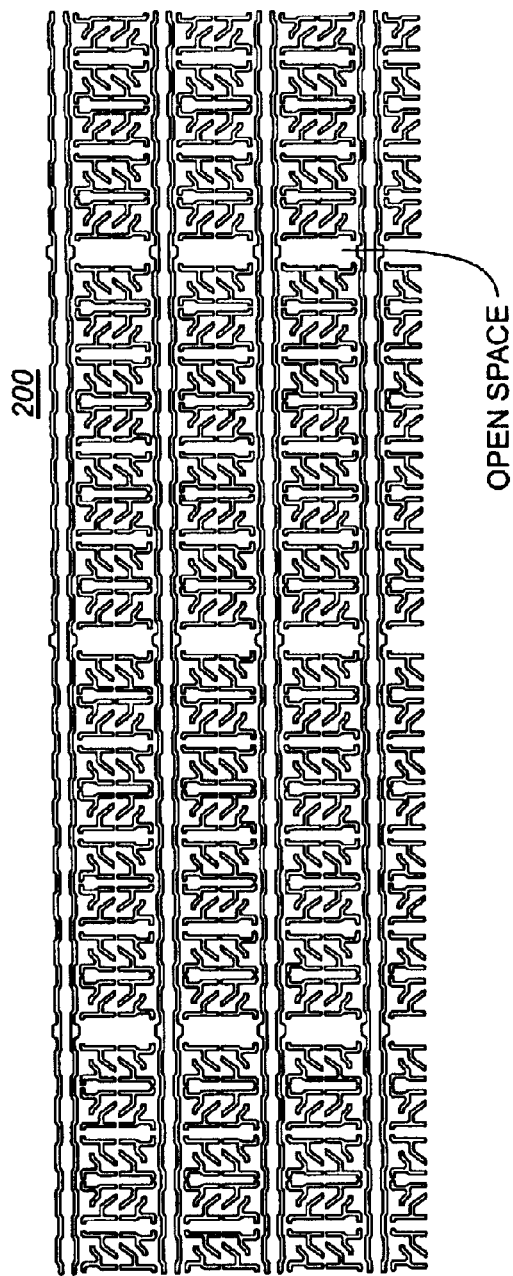
FIG._2
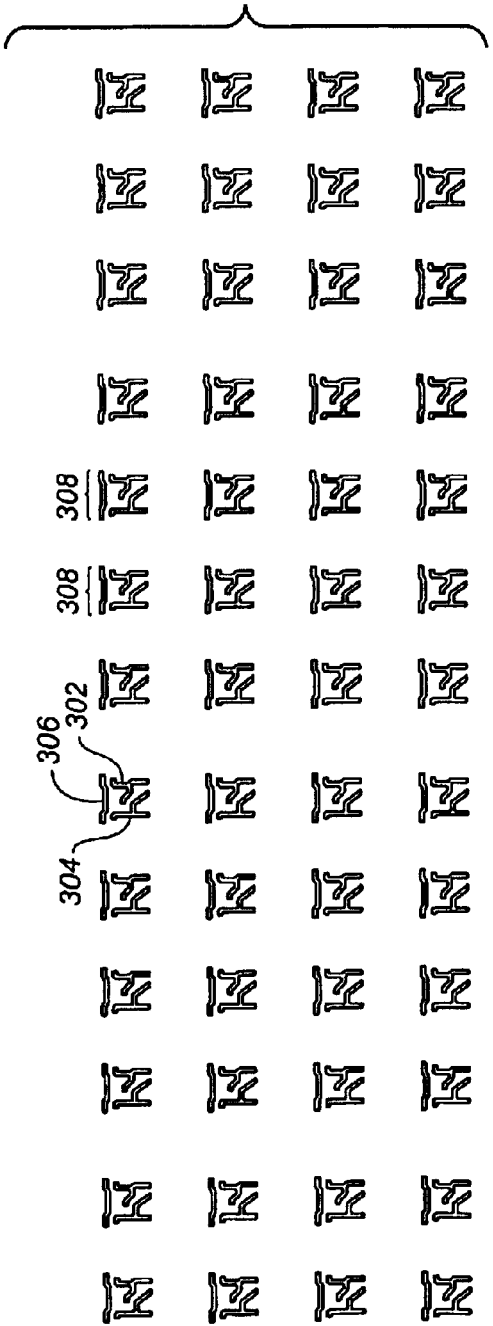
FIG._3

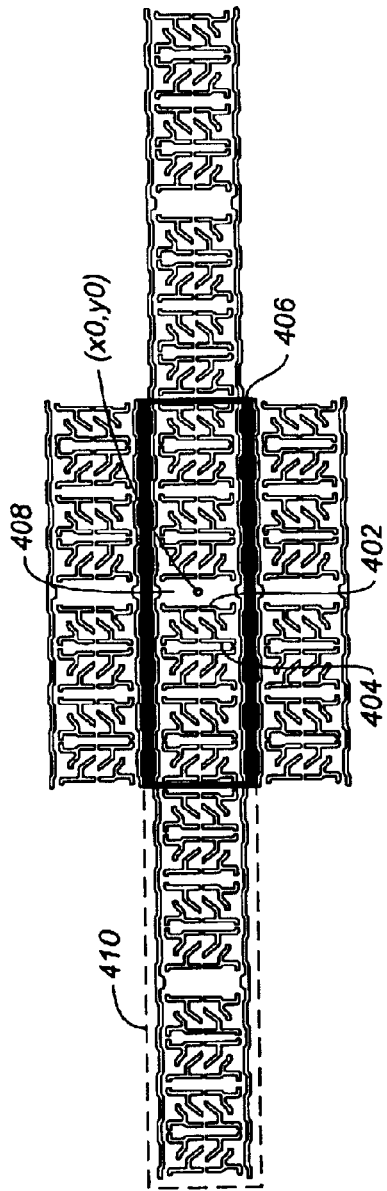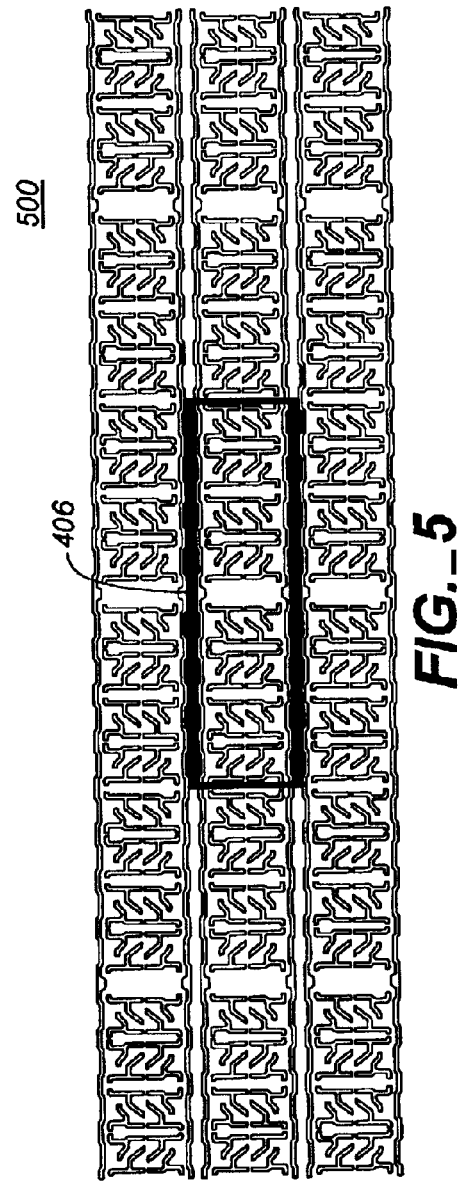

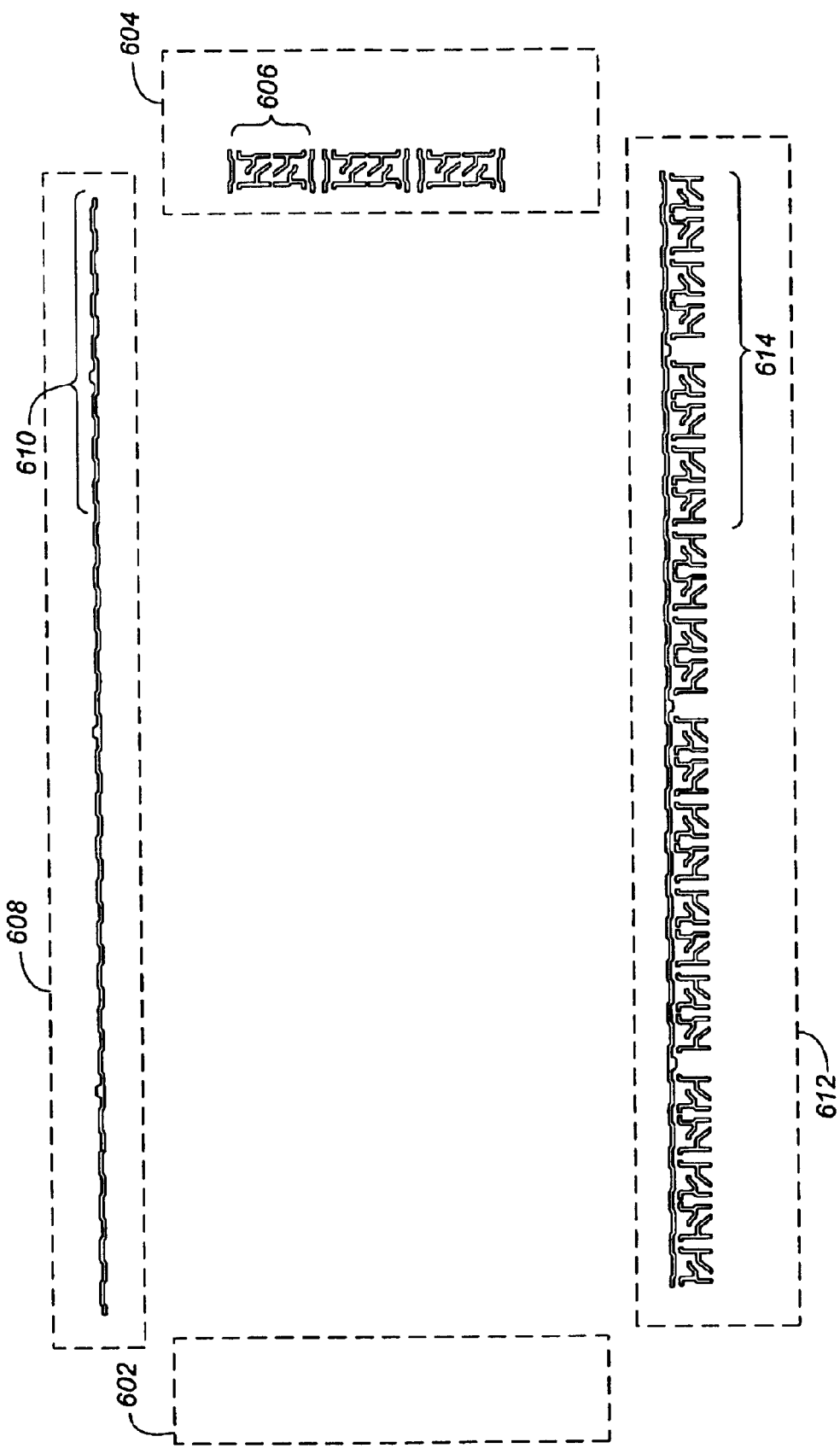
FIG._6

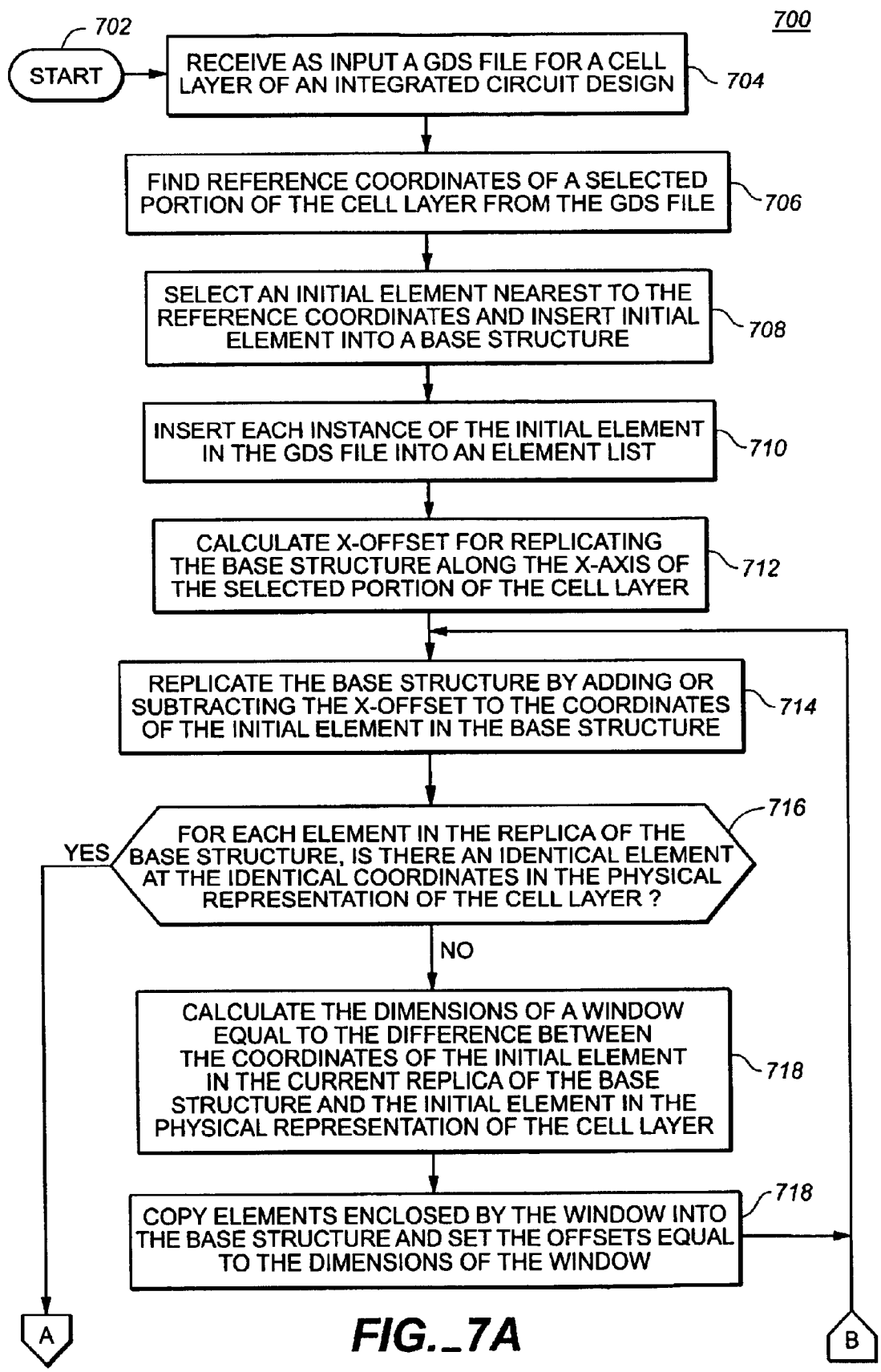
FIG._7A

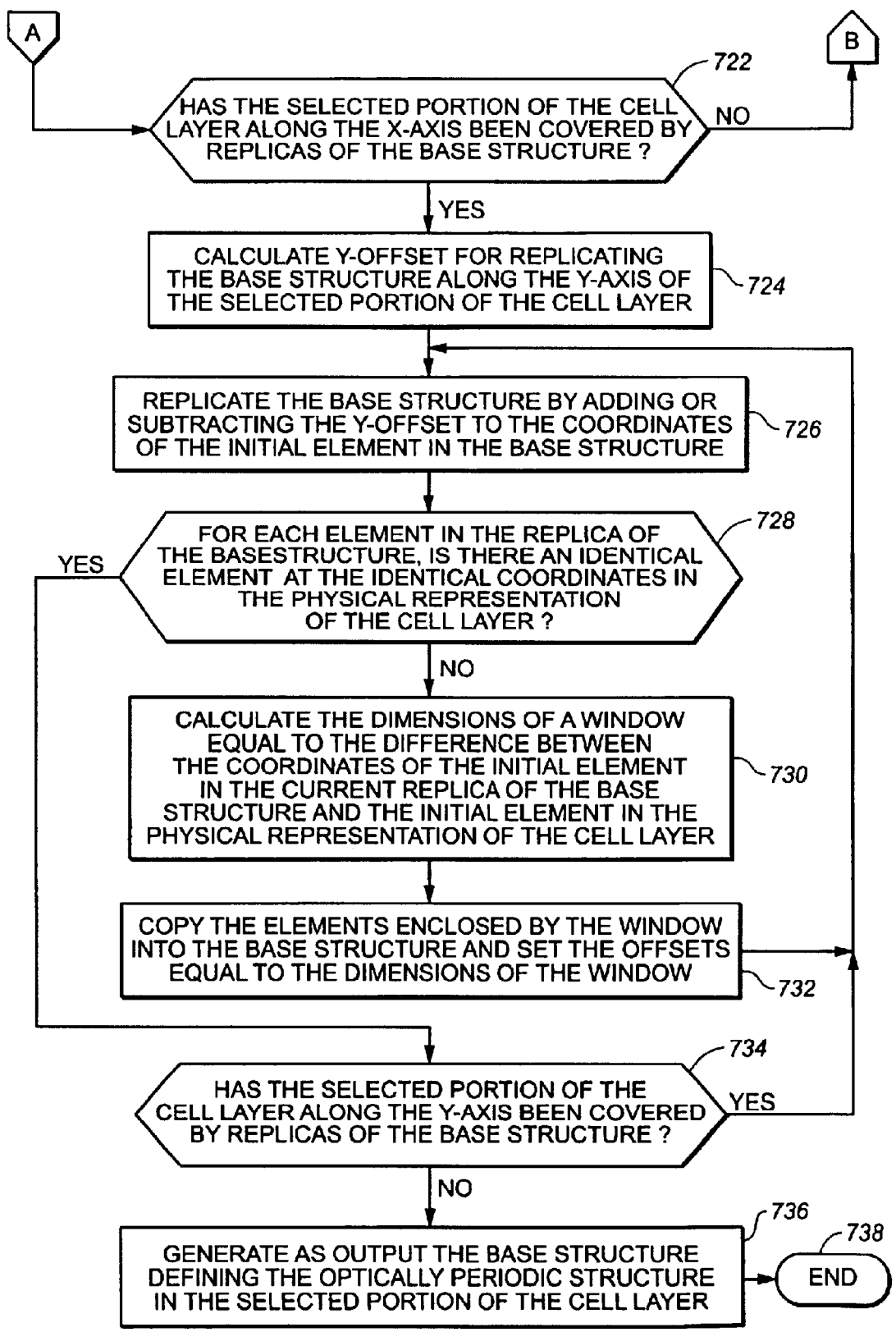
FIG._7B

AUTOMATIC RECOGNITION OF AN OPTICALLY PERIODIC STRUCTURE IN AN INTEGRATED CIRCUIT DESIGN

FIELD OF THE INVENTION

The present invention relates generally to finding periodic structures in a layer of an integrated circuit that have identical optical properties. More specifically, but without limitation thereto, the present invention relates to finding an optically periodic structure in a cell layer of an integrated circuit design.

BACKGROUND OF THE INVENTION

Photolithography is a common technique employed in the manufacture of semiconductor devices. Typically, a semiconductor wafer is coated with a layer of light-sensitive material, called photoresist. Using a patterned mask, or reticle, the semiconductor wafer is exposed to light, typically actinic radiation, projected through the reticle onto the photoresist, which is chemically altered in the areas exposed to the light. The chemically altered areas of the photoresist are removed by chemical etching, leaving a pattern of photoresist lines on the semiconductor wafer that ideally is identical to the reticle pattern. The photoresist pattern is used to create semiconductor devices on the semiconductor wafer.

The degree to which the resulting photoresist pattern corresponds to the reticle pattern is critical to the fabrication of semiconductor devices on the semiconductor wafer. Errors or deviations from the reticle pattern in the photoresist pattern may result in malfunction of semiconductor devices formed on the semiconductor wafer. The shape and proximity of features in the reticle pattern introduce optical proximity effects such as diffraction that may result in errors and deviations in the photoresist pattern.

The variation of light intensity as a function of position in the image plane of the optical projection system used to project the reticle pattern defines the aerial image. Methods for simulating the aerial image, for example, as described in U.S. Pat. No. 6,171,731, are used in optical proximity correction (OPC) techniques to modify the reticle pattern until the resulting simulated aerial image is within a selected tolerance. The modified reticle pattern is then used to fabricate a mask for the actual production of semiconductor devices on semiconductor wafers.

A standard GDS file format for a cell generally has a hierarchical structure that defines a functional structure in several layers. For example, the GDS file for a memory cell may define cell structures for transistors in a poly layer, interconnections between the transistors in a series of metal layers, and so on. Disadvantageously, the functional structures defined in the GDS file are not suitable for optical proximity correction techniques used in fabricating a production mask, where a description of the hierarchy of the optical geometry of the cell is needed.

SUMMARY OF THE INVENTION

A method of finding an optically periodic structure in a cell layer of an integrated circuit design includes receiving as input a physical representation of a cell layer of an integrated circuit design, finding reference coordinates of a selected portion of the cell layer from the physical representation of a cell layer, selecting an initial element located nearest to the reference coordinates, and constructing a base structure that includes the initial element and a minimum number of elements in the physical representation of the cell layer wherein the base structure may be replicated at an X-offset and a Y-offset to fill the entire selected portion so that for each element in each replica of the base structure there is an identical element at identical coordinates in the physical representation of the cell layer.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates the location of various selected portions of a cell layer in accordance with an embodiment of the present invention;

FIG. 2 illustrates an example of a physical representation of a cell layer of a memory cell of an integrated circuit from a GDS file of the prior art;

FIG. 3 illustrates a geometric hierarchy of the periodic elements in the cell layer of FIG. 2;

FIG. 4 illustrates the construction of a base structure for the cell layer in FIG. 2 in accordance with an embodiment of the present invention;

FIG. 5 illustrates the replication of the final base structure in a facsimile of the interior portion of the cell layer in accordance with an embodiment of the present invention;

FIG. 6 illustrates base structures for the borders of the cell layer of FIG. 2 constructed in accordance with an embodiment of the present invention; and FIG. 7 illustrates a flow chart of a method of automatically identifying an optically periodic structure in a cell layer of an integrated circuit design in accordance with an embodiment of the present invention.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

In one aspect of the present invention, the functional hierarchy of a GDS file for a cell is transformed into a geometric hierarchy of optically identical periodic structures for input to an optical proximity correction procedure. In one embodiment, a method of finding an optically periodic structure in a cell layer of an integrated circuit design includes receiving as input a physical representation of a cell layer of an integrated circuit design, finding reference coordinates of a selected portion of the cell layer from the physical representation of a cell layer, selecting an initial element located nearest to the reference coordinates, and constructing a base structure that includes the initial element and a minimum number of elements in the physical representation of the cell layer wherein the base structure may be replicated at an X-offset and a Y-offset to fill the entire selected portion so that for each element in each replica of the base structure there is an identical element at identical coordinates in the physical representation of the cell layer.

FIG. 1 illustrates the location of various selected portions of a cell layer in accordance with an embodiment of the present invention. Shown in FIG. 1 are an interior portion 102, a left border structure 104, an upper left corner structure 106, a top border structure 108, an upper right corner structure 110, a right border structure 112, a lower right corner structure 114, a bottom border structure 116, and a lower left corner structure 118.

The interior portion 102 generally contains the highest number of optically periodic structures in the physical representation of a cell layer.

FIG. 2 illustrates an example of a representation of a cell layer 200 of a memory cell from a GDS file of the prior art.

The cell layer 200 includes multiple elements defined by boundaries and open spaces.

FIG. 3 illustrates a geometric hierarchy of the periodic elements in the cell layer 200 of FIG. 2. Shown in FIG. 3 are cells 302, 304, 306, and 308.

In the first level of the hierarchy, cells 302 are periodic, that is, they are repeated in the cell layer 200. However, they are separated by the intervening cells 304 and 306 that are not identical to the cells 302.

In the second level of the hierarchy, cells 308, which include cells 302, 304, and 306, are identical, however, the second level of the hierarchy still lacks the open spaces shown in the cell layer of FIG. 2.

FIG. 4 illustrates the construction of a base structure for the cell layer 200 in FIG. 2 in accordance with an embodiment of the present invention. Shown in FIG. 4 are center coordinates (x0,y0), an initial element 402, a next element 404, a base structure 406 including the open space 408, and a replica of the base structure 410.

The base structure 406 of a selected portion of the cell layer 200 is constructed by finding reference coordinates, for example, the center coordinates (x0,y0), of the cell layer from a physical representation of the cell, preferably a GDS file, although other descriptions of the cell layer may be used to construct the base structure 406 according to various embodiments of the present invention. The base structure 406 is initially set equal to only the initial element 402 nearest to the center coordinates (x0,y0) containing only boundaries, because only the boundaries determine the optical properties of the cell layer 200. Examples of elements containing only boundaries used to construct the base structure are a point, a line, a rectangle, and a polygon.

The initial element 402 is found by searching the GDS file and selecting the element nearest to the center coordinates (x0,y0) that contains only boundaries. The coordinates of the initial element and each element in the GDS file that is identical to the initial element are inserted into an element list. The difference between the coordinates of the initial element and an element from the element list nearest, for example, to the left of the initial element, are calculated as an X-offset. The base structure 406 that now contains the initial element 402 is replicated by repeatedly adding or subtracting the offset to the coordinates of the initial element to replicate the base structure along each direction on the X-axis. Each replica of the base structure 406 is compared to the physical representation of the cell as follows. If for each element in the replica of the base structure 406 there is an identical element at the identical coordinates in the physical representation of the cell, then the comparison is successful. If the comparison is successful, then the next replica of the base structure 406 is compared with the physical representation of the cell. If all comparisons are successful in both directions along the X-axis, then the same procedure is repeated to calculate a Y-offset to the element in the element list nearest to the initial element below the initial element and to replicate the base structure 406 along the Y-axis until the entire selected portion of the cell layer 200 has been filled with replicas of the base structure 406.

If a comparison is not successful, then the dimensions of a window having a width equal to the difference between the X-coordinates of the initial element in the current replica of the base structure and the initial element in the physical representation of the cell layer and a height equal to the difference between the Y-coordinates of the initial element in the current replica of the base structure and the initial element in the physical representation of the cell layer are calculated. If the difference between the Y-coordinates is zero, then the height of the window is set to the height of the base structure. The elements in the physical representation that are enclosed within the window are included in the base structure 406, and the X- and Y-offsets are set equal to the width and height of the window, respectively.

When all the comparisons are successful, the base structure 406 contains the minimum number of elements that may be used to represent the entire selected portion of the cell layer 200. The resulting base structure 406 is optically periodic within the interior portion of the cell layer 200 in each direction (left, right, up, and down) from the base structure 406.

FIG. 5 illustrates the replication of the final base structure 406 in a facsimile 500 of the interior portion of the cell layer 200 in accordance with an embodiment of the present invention. The base structures for the remaining border structures 104, 108, 112, and 116 are then constructed in a similar manner by finding the reference coordinates, for example, the center of the border structure, finding the nearest element to the reference coordinates of the border structure in the GDS file, and constructing a base structure for the border structure as described above for the interior portion. In the border structures, the replicas of the base structure in are periodic in two directions, either up and down for the left and right border structures, or left and right for the top and bottom border structures. In the interior portion, the replicas are periodic in all four directions. The corner structures are generally ignored, as they typically contain few if any periodic structures.

FIG. 6 illustrates base structures for the borders of the cell layer 200 of FIG. 2 constructed in accordance with an embodiment of the present invention. Shown in FIG. 6 are a left border 602, a right border 604, a right border base structure 606, a top border 608, a top border base structure 610, a bottom border 612, and a bottom border base structure 614.

In this example, the left border base structure 602 is empty.

Each of the respective base structures may be replicated to construct the entire corresponding border structure, therefore each of the base structures is optically periodic within the corresponding border structure.

FIG. 7 illustrates a flow chart 700 of a method of automatically identifying an optically periodic structure in a cell layer of an integrated circuit design in accordance with an embodiment of the present invention.

Step 702 is the entry point of the flow chart 700.

In step 704, a GDS file for a cell layer of an integrated circuit design is received as input. Although a GDS file is preferable, other physical representations of a cell layer may be used that include the same information extracted from the GDS file to locate elements and their coordinates in a cell layer.

In step 706, reference coordinates, for example, the center coordinates, of a selected portion of the cell layer are found from the GDS file.

In step 708, an initial element containing only boundaries that is nearest to the reference coordinates is selected and copied into a base structure.

In step 710, the coordinates of each instance of the initial element in the GDS file are copied into an element list.

In step 712, the difference between the coordinates of the initial element and the coordinates of an element from the element list nearest to the left of the initial element is calculated as an X-offset. Alternatively, the element nearest to the left of the initial element may be used to calculate the X-offset.

In step 714, the base structure is replicated by adding or subtracting the X-offset to the X-coordinate of the copy of the initial element in the base structure to replicate the base structure along each direction on the X-axis.

In step 716, if for each element in the replica of the base structure there is an identical element at the identical coordinates in the physical representation of the cell layer, then control is transferred to step 722. Otherwise, control is transferred to step 718.

In step 718, the X- and Y-dimensions of a window having a width equal to the difference between the X-coordinates of the initial element in the current replica of the base structure and the initial element in the physical representation of the cell layer and having a height equal to the difference between the Y-coordinates of the initial element in the current replica of the base structure and the initial element in the physical representation of the cell layer are calculated.

In step 720, the elements in the physical representation of the cell layer that are enclosed within the window are copied into the base structure, and the X and Y offsets are set equal to the width and height of the window, respectively. Control is then transferred back to step 714.

In step 722, if the selected portion of the cell layer along the X-axis has been covered by replicas of the base structure, then control is transferred to step 724. Otherwise, control is transferred back to step 714.

In step 724, the difference between the Y-coordinates of the initial element in the physical representation of the cell layer and an element from the element list nearest to the initial element below the initial element is calculated as a Y-offset. Alternatively, the element nearest to the initial element above the initial element may be used to calculate the Y-offset.

In step 726, the base structure is replicated by adding or subtracting the Y-offset to the Y-coordinate of the initial element to replicate the base structure along each direction on the Y-axis.

In step 728, if for each element in the replica of the base structure there is an identical element at the identical coordinates in the physical representation of the cell layer, then control is transferred to step 734. Otherwise, control is transferred to step 730.

In step 730, the dimensions of a window having a width equal to the difference between the X-coordinates of the initial element in the current replica of the base structure and the initial element in the physical representation of the cell layer and having a height equal to the difference between the Y-coordinates in the initial element of the current replica of the base structure and the initial element of the physical representation of the cell layer are calculated.

In step 732, the elements in the physical representation of the cell layer that are enclosed within the window are copied into the base structure, and the X- and Y-offsets are set equal to the width and height of the window, respectively. Control is then transferred to step 726.

In step 734, if the selected portion of the cell layer has been filled with replicas of the base structure along the Y-axis, then control is transferred to step 736. Otherwise, control is transferred to step 726.

In step 736, the base structure is generated as output defining the optically periodic structure in the selected portion of the cell layer.

Step 738 is the exit point of the flow chart 700.

As explained above, the selected portion of the cell layer may be the interior portion, the left border structure, the right border structure, the upper border structure, or the lower border structure. The procedure for finding the base structures for the border structures is similar to that described for the interior portion of the cell layer, except that the periodicity extends in two directions instead of four.

The flow chart illustrated in FIG. 7 may be embodied in a computer program product for finding an optically periodic structure in an integrated circuit design and implemented by instructions for a computer according to well known programming techniques to perform the following functions:

(a) receiving as input a physical representation for a cell layer of an integrated circuit design;

(b) finding reference coordinates of a selected portion of the cell layer from the physical representation of the cell layer;

(c) selecting an initial element nearest to the reference coordinates;

(d) copying coordinates of each instance of the initial element in the physical representation of the cell layer into an element list;

(e) inserting a copy of the initial element into a base structure;

(f) calculating a difference between the coordinates of the initial element and the coordinates of an element from the element list nearest to the left (or right) of the initial element as an X-offset;

(g) replicating the base structure by adding or subtracting the X-offset to the coordinates of the initial element in the base structure to replicate the base structure along each direction on the X-axis;

(h) if for each element in the replica of the base structure there is an identical element at the identical coordinates in the physical representation of the cell layer, then transferring control to (l), otherwise transferring control to (i).

(i) calculating dimensions of a window having a width equal to the difference between the X-coordinates of the initial element in the current replica of the base structure and the initial element in the physical representation of the cell layer and having a height equal to the difference between the Y-coordinates of the initial element in the current replica of the base structure and the initial element in the physical representation of the cell layer;

(j) copying the elements in the physical representation of the cell layer that are enclosed within the window into the base structure;

(k) setting the X and Y offsets equal to the width and height of the window, respectively, and transferring control to (g);

(l) if the selected portion of the cell layer has been filled with replicas of the base structure along the X-axis, then transferring control to (m), otherwise transferring control to (g);

(m) calculating a difference between the coordinates of the initial element and the coordinates of an element from the element list nearest to the initial element below (or above) the initial element as a Y-offset;

(n) replicating the base structure by adding or subtracting the Y-offset to the coordinates of the initial element in the base structure to replicate the base structure along each direction on the Y-axis;

(o) if for each element in the replica of the base structure there is an identical element at the identical coordinates in the physical representation of the cell layer, then transferring control to (s), otherwise transferring control to (p);

(p) calculating dimensions of a window having a width equal to the difference between the X-coordinates of the initial element in the current replica of the base structure and the coordinates of the initial element in the physical representation of the cell layer and having a height equal to the difference between the Y-coordinates of the initial element in the current replica of the base structure and the initial element in the physical representation of the cell layer;

(q) copying the elements in the physical representation of the cell layer that are enclosed within the window into the base structure;

(r) setting the X and Y offsets equal to the width and height of the window, respectively, and transferring control to (n);

(s) if the selected portion of the cell layer has been filled with replicas of the base structure along the Y-axis, then transferring control to (t), otherwise transferring control to (n); and (t) generating as output the base structure defining the optically periodic structure in the selected portion of the cell layer.

Although the methods of the present invention illustrated above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of finding an optically periodic structure in a cell layer of an integrated circuit design comprising:

receiving as input a physical representation of a cell layer of an integrated circuit design;

finding reference coordinates of a selected portion of the cell layer from the physical representation of the cell layer;

selecting an initial element located nearest to the reference coordinates wherein the initial element includes boundaries that determine optical properties of the cell layer;

constructing a base structure that includes the initial element and a number of elements in the physical representation of the cell layer;

generating a replica of the base structure at an X-offset and a Y-offset to fill the entire selected portion so that for each element in each replica of the base structure there is an identical element at identical coordinates in the physical representation of the cell layer; and generating as output the base structure defining the optically periodic structure in the selected portion of the cell layer.

2. The method of claim 1 wherein the boundaries define one of a point, a line, a rectangle, and a polygon.

3. The method of claim 1 wherein the physical representation of a cell layer is a GDS file.

4. The method of claim 1 wherein the selected portion of the cell layer is one of an interior portion, a left border structure, a right border structure, a top border structure, and a bottom border structure.

5. The method of claim 1 wherein the reference coordinates are center coordinates.

6. A method of finding an optically periodic structure in a cell layer of an integrated circuit design comprising:

(a) receiving as input a physical representation for a cell layer of an integrated circuit design;

(b) finding reference coordinates of a selected portion of the cell layer from the physical representation of the cell layer;

(c) selecting an initial element nearest to the reference coordinates;

(d) copying coordinates of each instance of the initial element in the physical representation of the cell layer into an element list;

(e) inserting a copy of the initial element into a base structure;

(f) calculating a difference between the coordinates of the initial element and the coordinates of an element from the element list nearest to the left or right of the initial element as an X-offset;

(g) adding or subtracting the X-offset to the coordinates of the initial element in the base structure to generate a replica of the base structure along each direction on the X-axis;

(h) if for each element in the replica of the base structure along each direction on the X-axis there is an identical element at the identical coordinates in the physical representation of the cell layer, then transferring control to (l), otherwise transferring control to (i), (i) calculating dimensions of a window having a width equal to the difference between the X-coordinates of the initial element in the replica of the base structure along each direction on the X-axis and the initial element in the physical representation of the cell layer and having a height equal to the difference between the Y-coordinates of the initial element in the replica of the base structure along each direction on the X-axis and the initial element in the physical representation of the cell layer;

(j) copying the elements in the physical representation of the cell layer that are enclosed within the window into the base structure;

(k) setting the X and Y offsets equal to the width and height of the window, respectively, and transferring control to (g);

(l) if the selected portion of the cell layer has been filled with replicas of the base structure along each direction on the X-axis, then transferring control to (m), otherwise transferring control to (g);

(m) calculating a difference between the coordinates of the initial element and the coordinates of an element from the element list nearest to the initial element below or above the initial element as a Y-off set;

(n) adding or subtracting the Y-off set to the coordinates of the initial element in the base structure to generate a replica of the base structure along each direction on the Y-axis;

(o) if for each element in the replica of the base structure along each direction on the Y-axis there is an identical element at the identical coordinates in the physical representation of the cell layer, then transferring control to (s), otherwise transferring control to (p);

(p) calculating dimensions of a window having a width equal to the difference between the X-coordinates of the initial element in the replica of the base structure along each direction on the Y-axis and the coordinates of the initial element in the physical representation of the cell layer and having a height equal to the difference between the Y-coordinates of the initial element in the replica of the base structure along each direction on the Y-axis and the initial element in the physical representation of the cell layer;

(q) copying the elements in the physical representation of the cell layer that are enclosed within the window into the base structure;

(r) setting the X and Y offsets equal to the width and height of the window, respectively, and transferring control to (n);

(s) if the selected portion of the cell layer has been filled with replicas of the base structure along each direction on the Y-axis, then transferring control to (t), otherwise transferring control to (n); and (t) generating as output the base structure defining the optically periodic structure in the selected portion of the cell layer.

7. The method of claim 6 wherein the selected portion of the cell layer is one of an interior portion, a left border structure, a right border structure, a top border structure, and a bottom border structure.

8. The method of claim 6 wherein the initial element includes boundaries that determine optical properties of the cell layer.

9. The method of claim 8 wherein the boundaries define one of a point, a line, a rectangle, and a polygon.

10. The method of claim 9 wherein the physical representation of a cell layer is a GDS file.

11. The method of claim 6 wherein the reference coordinates are center coordinates.

12. A computer program product for finding an optically periodic structure in a cell layer of an integrated circuit design comprising:

a medium for embodying a computer program for input to a computer; and a computer program embodied in the medium for causing the computer to perform the following functions:

(a) receiving as input a physical representation for a cell layer of an integrated circuit design;

(b) finding reference coordinates of a selected portion of the cell layer from the physical representation of the cell layer;

(c) selecting an initial element nearest to the reference coordinates;

(d) copying coordinates of each instance of the initial element in the physical representation of the cell layer into an element list;

(e) inserting a copy of the initial element into a base structure;

(f) calculating a difference between the coordinates of the initial element and the coordinates of an element from the element list nearest to the left or right of the initial element as an X-off set;

(g) adding or subtracting the X-offset to the coordinates of the initial element in the base structure to generate a replica of the base structure along each direction on the X-axis;

(h) if for each element in the replica of the base structure along each direction on the X-axis there is an identical element at the identical coordinates in the physical representation of the cell layer, then transferring control to (l), otherwise transferring control to (i), (i) calculating dimensions of a window having a width equal to the difference between the X-coordinates of the initial element in the replica of the base structure along each direction on the X-axis and the initial element in the physical representation of the cell layer and having a height equal to the difference between the Y-coordinates of the initial element in the replica of the base structure along each direction on the X-axis and the initial element in the physical representation of the cell layer;

(j) copying the elements in the physical representation of the cell layer that are enclosed within the window into the base structure;

(k) setting the X and Y offsets equal to the width and height of the window, respectively, and transferring control to (g);

(l) if the selected portion of the cell layer has been filled with replicas of the base structure along each direction on the X-axis, then transferring control to (m), otherwise transferring control to (g);

(m) calculating a difference between the coordinates of the initial element and the coordinates of an element from the element list nearest to the initial element below or above the initial element as a Y-offset;

(n) adding or subtracting the Y-off set to the coordinates of the initial element in the base structure to generate a replica of the base structure along each direction on the Y-axis;

(o) if for each element in the replica of the base structure along each direction on the Y-axis there is an identical element at the identical coordinates in the physical representation of the cell layer, then transferring control to (s), otherwise transferring control to (p);

(p) calculating dimensions of a window having a width equal to the difference between the X-coordinates of the initial element in the replica of the base structure along each direction on the Y-axis and the coordinates of the initial element in the physical representation of the cell layer and having a height equal to the difference between the Y-coordinates of the initial element in the replica of the base structure along each direction on the Y-axis and the initial element in the physical representation of the cell layer;

(q) copying the elements in the physical representation of the cell layer that are enclosed within the window into the base structure;

(r) setting the X and Y offsets equal to the width and height of the window, respectively, and transferring control to (n);

(s) if the selected portion of the cell layer has been filled with replicas of the base structure along each direction on the Y-axis, then transferring control to (t), otherwise transferring control to (n); and (t) generating as output the base structure defining the optically periodic structure in the selected portion of the cell layer.

13. The computer program product of claim 12 wherein the selected portion of the cell layer is one of an interior portion, a left border structure, a right border structure, a top border structure, and a bottom border structure.

14. The computer program product of claim 12 wherein the initial element includes boundaries that determine optical properties of the cell layer.

15. The computer program product of claim 14 wherein the boundaries define one of a point, a line, a rectangle, and a polygon.

16. The computer program product of claim 12, wherein the physical representation of a cell layer is a GDS file.

17. The method of claim 12 wherein the reference coordinates are center coordinates.

* * * * *